United States Patent
Dreps et al.

(10) Patent No.: US 6,922,085 B2
(45) Date of Patent: Jul. 26, 2005

(54) COMPARATOR AND METHOD FOR DETECTING A SIGNAL USING A REFERENCE DERIVED FROM A DIFFERENTIAL DATA SIGNAL PAIR

(75) Inventors: Daniel Mark Dreps, Georgetown, TX (US); Frank David Ferraiolo, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/616,012

(22) Filed: Jul. 8, 2003

(65) Prior Publication Data

US 2004/0051565 A1 Mar. 18, 2004

Related U.S. Application Data

(62) Division of application No. 09/870,623, filed on May 31, 2001.

(51) Int. Cl.$^7$ .............................................. H03K 5/22
(52) U.S. Cl. ......................... 327/65; 330/253; 330/258
(58) Field of Search ........................... 327/65, 66, 333, 327/563; 330/252, 253, 258

(56) References Cited

U.S. PATENT DOCUMENTS 5,936,466 A * 8/1999 Andoh et al. ................ 330/253

* cited by examiner

Primary Examiner—Kenneth B. Wells
(74) Attorney, Agent, or Firm—Weiss, Moy & Harris, P.C.; Andrew M. Harris; Casimer K. Salys

(57) ABSTRACT

A comparator and method for detecting a signal using a reference derived from a differential data signal pair improves performance of an interface. A differential pair of data signals and at least one single-ended data signal are transmitted over the interface. The differential pair of data signals is received by a differential receiver and the single-ended data signals are received by a receiver that uses the differential pair of data signals to improve the detection of the single-ended data signal. A novel comparator circuit provides the comparison, using a voltage or current level of the single-ended signal to determine states of the differential data signal pair.

18 Claims, 4 Drawing Sheets

COMPARATOR AND METHOD FOR DETECTING A SIGNAL USING A REFERENCE DERIVED FROM A DIFFERENTIAL DATA SIGNAL PAIR

CROSS-REFERENCE TO RELATED APPLICATIONS

This application is a divisional application of pending U.S. patent application Ser. No. 09/870,623, entitled "METHOD AND APPARATUS FOR INTERFACE SIGNALING USING SINGLE-ENDED AND DIFFERENTIAL DATA SIGNALS", filed on May 31, 2001 and from which it claims priority under 35 U.S.C. §121. The complete disclosure of the above-referenced parent application is incorporated herein by reference.

BACKGROUND OF THE INVENTION

1. Technical Field

The present invention relates generally to electronic logic circuits, and more particularly, to a comparator for comparing single-ended signals using a reference derived from a differential signal pair.

2. Description of the Related Art

Interfaces between present-day integrated circuits have increased in operating frequency and width. In particular, microprocessor systems components require both wide and fast connection. Data width directly affects the speed of data transmission between systems components, as does the data rate, which is limited by the maximum frequency that can be supported by an interface.

Present-day systems interconnect designs use transmission line techniques to improve signal transmission/reception. Low voltage and current signaling levels are desirable to reduce driver size, power consumption/dissipation and electromagnetic interference (EMI). Reduced signal levels require improved detection techniques, such as that provided by a differential signaling scheme.

A differential signaling scheme provides a significant improvement over single-ended signaling, as a differential interface is far less susceptible to common mode noise, produces a more uniform load on the interface power supplies and has a reduced bit error rate (BER).

However, an exclusively differential interface requires twice the number of interconnects and associated drivers, as well as a differential receiver for each data signal. Due to the large data widths required in present-day systems, it is not practical to implement a completely differential interface. Interfaces have been developed to improve the detection of single-ended signals, but these require transmission of separate clock signals or other reference signals that provide improved performance, but require interconnects for the reference signals. Additionally, the fan-out requirements of the reference signals complicate the scalability of the designs. When interface width is increased, the number of receivers is also increased, increasing the load on the reference signal, compromising interface performance or requiring additional signal paths and drivers to provide more reference interconnects.

It is therefore desirable to provide a method and apparatus for interface signaling using single-ended and differential data signals without requiring separate reference signals.

SUMMARY OF THE INVENTION

The objective of interface signaling using single-ended and differential data signals without requiring separate reference signals is accomplished in a method and apparatus for comparing single-ended data signals using a differential pair of signals as a reference so that the detection of the single-ended data signals is enhanced. The single-ended data signals are detected using novel singlential comparators having a differential data signal input and a single-ended data signal input.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

Figure 1:
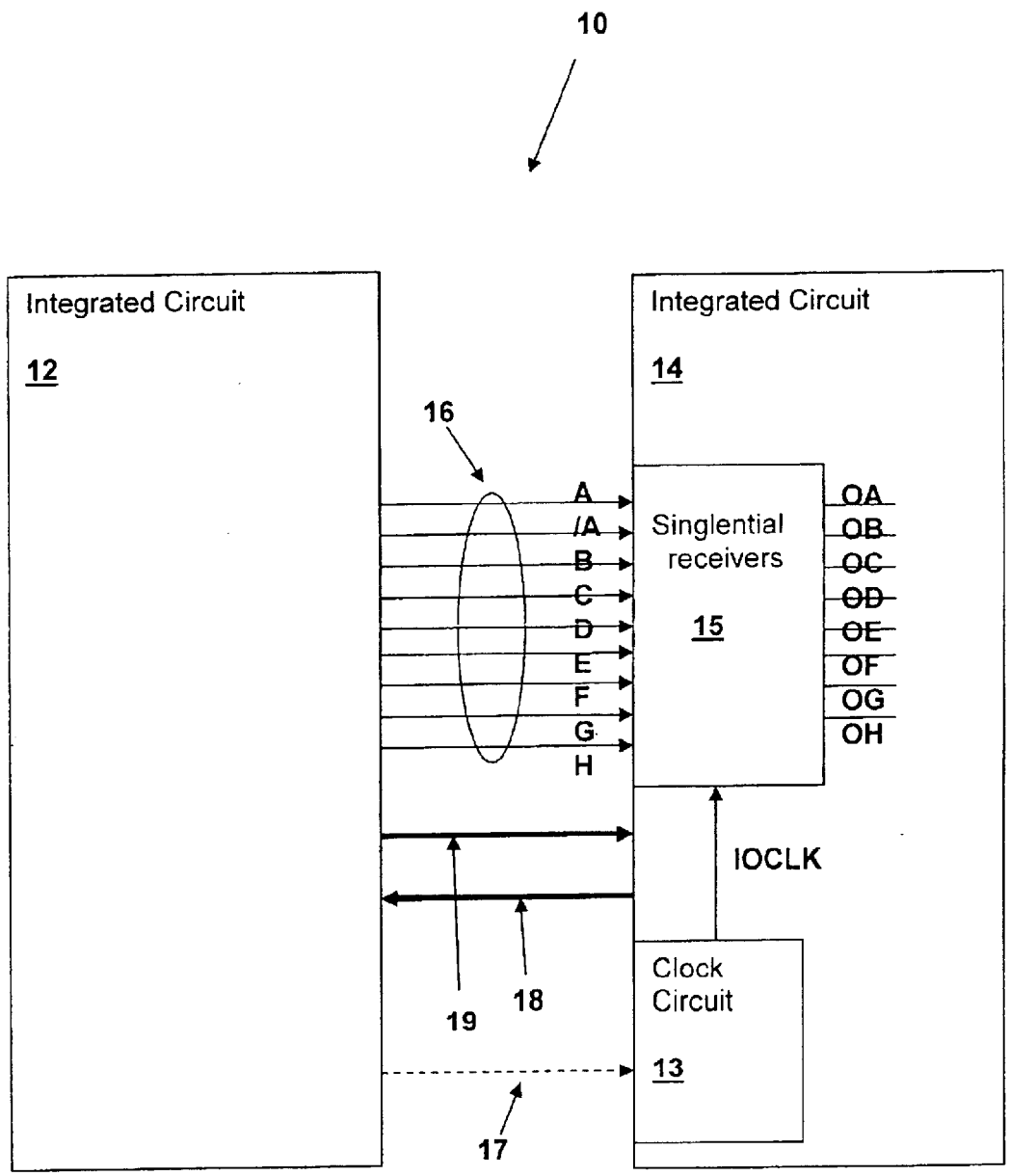
FIG. 1 is a block diagram of an interface in accordance with a preferred embodiment of the invention.

With reference now to the figures, and in particular with reference to FIG. 1, there is depicted a block diagram of an interface 10 in accordance with a preferred embodiment of the invention. Integrated circuit 12 is coupled to a second integrated circuit 14 by a data bus 16, a data bus 18, a data bus 19 and an optional clock signal 17. While bus 16 is illustrated as a unidirectional bus coupling signals transmitted from integrated circuit 12 to integrated circuit 14 and while bus 16 will be the focus of the illustrative description, it should be understood that the techniques and circuits of the present invention apply to bidirectional buses and the integrated circuit 12 may include circuitry as illustrated in integrated circuit 14 to receive signals transmitted from integrated circuit 14 to integrated circuit 12 via bus 18.

To achieve high speed, low power and low noise in interface designs, all of which are desirable characteristics, the signals transmitted from integrated circuit 12 to integrated circuit 14 by bus 16 are detected with special circuits. As the signal swing is reduced or the signaling frequency is increased, receivers are employed to reduce interface error. The present invention uses a novel combination of single-ended signals (illustrated as signals B–H) and a differential signal (illustrated as signal A and /A) to achieve the above-mentioned objectives.

Existing interface techniques use separate voltage reference signals or combined clock/voltage reference signals to provide a reference for receivers, permitting rejection of common-mode noise and common-mode voltage variations. The present invention uses a differential data signal to provide such voltage reference. Advantages of the present invention include reduction of signals required (as a separate reference signal is not required) and scalability of the design. When bus width is increased, the fan-out of a separate reference signal is consequently increased and at some point it will be necessary to add more reference signals to detect the added data signals, due to the loading of the reference signal by the receiver circuits.

Additionally, in an actual integrated circuit layout, input/output (I/O) blocks are generally large with respect to other circuits due to the drive requirement of the transmitters and power dissipation in the receivers, so it may not be possible to co-locate all of the I/O blocks associated with a given interface. In this case, it would not be desirable to route a single reference signal between I/O blocks that are far apart on an actual integrated circuit die. Common-mode noise and voltage levels will vary between distant blocks. Therefore it is more desirable to use a differential data pair associated in common I/O blocks for detection of single-ended data signals in order to provide the best tracking and common-mode noise rejection for that group of signals.

The present invention uses a differential data signal to detect multiple other single-ended data signals. While the illustrative embodiment of FIG. 1 depicts a grouping of eight data signals where one of the signals is differential, the actual ratio of differential to single ended signals within a given bus is a design choice made by the characteristics desired and an implementation of the present invention may use a single differential pair to detect larger or smaller number of single-ended signals.

The circuits used to detect the data signals within bus 16 are singlential receivers 15 included within integrated circuit 14. Singlential receivers 15 receive data signals A–H from bus 16 and produce data outputs OA–OH for connection to other circuits within integrated circuit 14. A clock circuit 13 provides an IOCLK signal to clock latches within singlential receivers 15. The IOCLK signal may be derived in a variety of manners. Optional interface clock signal 17 (which may be a single-ended signal or a differential pair) may be detected to provide an interface clock that is synchronous with data signals A–H. Alternatively, clock circuit 13 may be coupled to one or more of data signals A–H and include clock reconstruction circuits to generate a clock from one or more of data signals A–H. The IOCLK signal provides a timing reference for the detection of data signals A–H, but the voltage reference is provided by the differential data signal pair A and /A.

Figure 2:
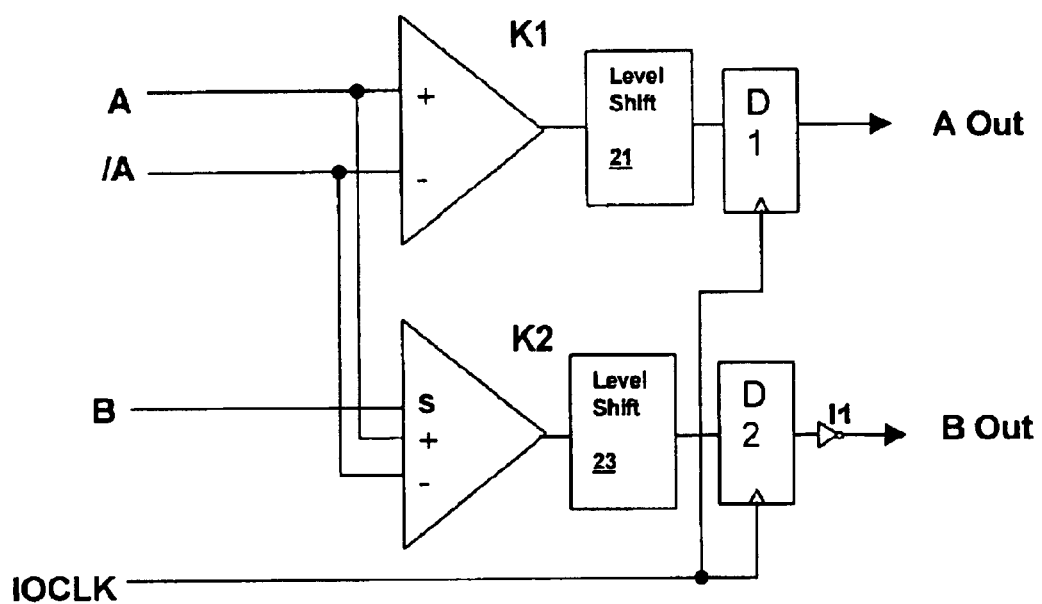
FIG. 2 is a schematic diagram of a receiver in accordance with a preferred embodiment of the invention.

Referring now to FIG. 2, a schematic diagram of a singlential receiver in accordance with a preferred embodiment of the invention is depicted. A differential comparator K1 compares signals A and /A to produce an output signal that is latched by a latch D1 to produce an output data signal A Out. A level shift 21 is coupled to the output of comparator K1 to remove shift in the logic low output level of the comparator due to the presence of common mode voltage on the input signals. Latch D1 latches the output of level shift 21 on the rising edge of IOCLK (IOCLK is a clock signal derived such that data will be stable at the outputs of comparator K1 when IOCLK rises). A novel singlential comparator K2 receives the differential pair comprising signals A and /A as well as single-ended data signal B. Singlential comparator K2 detects data signal B such that a common-mode voltage appearing on signals B, A, and /A is rejected. A level shift 23 couples the output of singlential comparator K2 to a latch D2. Level shift 23 removes variations in the logic low voltage level on the output of singlential comparator K2 due to the presence of common mode voltage on the input signals.

The output of level shift 23 is latched by latch D2 which is clocked by the IOCLK signal and inverted by inverter I1 to produce a data output signal B Out. If data signal B is at a low logic level (corresponding to a lower voltage level), the output of singlential comparator K2 will be at a high logic level, causing latch D2 to latch a high logic level at its output and coupling a high logic level input to inverter I1. The result of the operation of the circuit of FIG. 2 is an A Out signal and a B Out signal that are very closely time-aligned, are representative of their corresponding A and B data input signals and have common mode error removed.

Figure 3A:
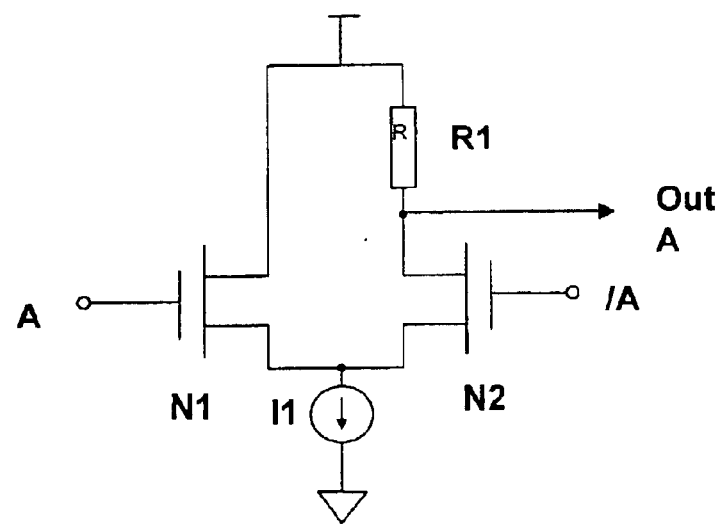
FIG. 3A is a schematic diagram of the differential comparator of FIG. 2 in accordance with a preferred embodiment of the invention.

Referring now to FIG. 3A, a detailed schematic of differential comparator K1 of FIG. 2 is depicted. N-channel transistor N1 and N-channel transistor N2 form a differential pair. When the voltage of data signal A is higher than the voltage of complementary data signal /A, N-channel transistor N1 will provide the majority of the current sourced into constant-current sink I1, causing the voltage at Out A to assume a high logic level. Conversely when the voltage of data signal A is lower than the voltage of complementary data signal /A, N-channel transistor N2 will provide the majority of the current sourced into constant-current sink I1, causing the voltage at Out A to assume a low logic level by drawing current through resistor R1 which has a resistance value of R.

The logic low output level of differential comparator K1 is Vdd−IR where I is the current source magnitude and Vdd is the positive power supply voltage. For positive levels of the common-mode voltage appearing on the gates of transistors N1 and N2, it is understood that both transistors N1 and N2 will conduct, raising the voltage across current source I1 and thus the logic low output level. The variation in logic low output level of comparator K1 can be compensated for by using a level shifting circuit or by using a negative power supply rail that is below the desired logic low output voltage.

Figure 3B:
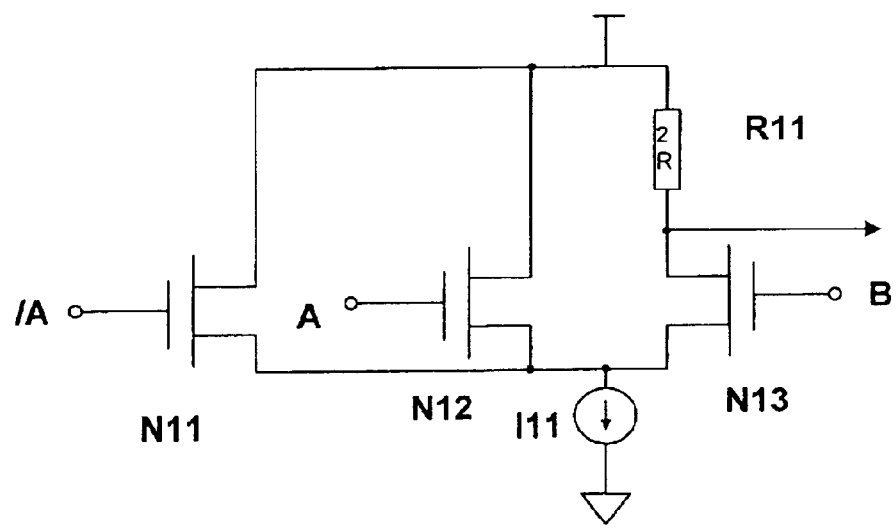
FIG. 3B is a schematic diagram of the singlential comparator of FIG. 2 in accordance with a preferred embodiment of the invention.

Referring now to FIG. 3B, a detailed schematic of singlential comparator K2 of FIG. 1 is depicted. N-channel transistors N11 and N12 form one side of a quasi-differential pair. N-channel transistor N13 provides the other side of the quasi-differential pair. When the voltage of data signal B is at a high logic level, N-channel transistor N13 will share current sourced into constant-current sink I11 with the differential input transistor (N11 or N12) coupled to the differential input signal that is also at a high logic level. The current sourced through transistor N13 causes the voltage at Out B to assume a low logic level by drawing current through resistor R11 which has a resistance value of 2R. Conversely, when the voltage of data signal B is at a low voltage level, the transistor (N11 or N12) coupled to the differential input signal that is at a high logic level will conduct the majority of the current sourced into constant-current sink I11, causing the voltage at Out B to assume a high logic level.

The logic low output level of singlential comparator K2 is Vdd−IR where I is the current source magnitude and Vdd is the positive power supply voltage. Resistor R11 is twice the value of the differential comparator K1 output resistor R1, but transistor N13 will only conduct approximately half of the current source I11 current. For positive levels of the common-mode voltage appearing on the gates of transistors N11, N12 and N13, it is understood that all of transistors N11, N12 and N13 will conduct, raising the voltage across current source I11 and thus the logic low output level. The variation in logic low output level of comparator K2 can be compensated for by using a level shifting circuit or by using a negative power supply rail that is below the desired logic low output voltage. The effect of resistor R11 in raising the impedance of the current path through transistor N13 over that of the transistor (N11 or N12) that is receiving a logic high gate input may be adjusted by sizing transistor N13 slightly larger than transistors N11 and N12.

The singlential comparator thus removes common mode error by sharing current equally with a single-ended input stage when the single-ended input signal is in a high logic state and shunting current away from the single-ended input state when the single-ended input signal is in a low logic state. Since the sharing or shunting action of the differential input transistors is controlled by constant-current sink I11, common mode error is cancelled, since the shared current and the shunted current are substantially constant within a useable range of input signals.

Figure 4:
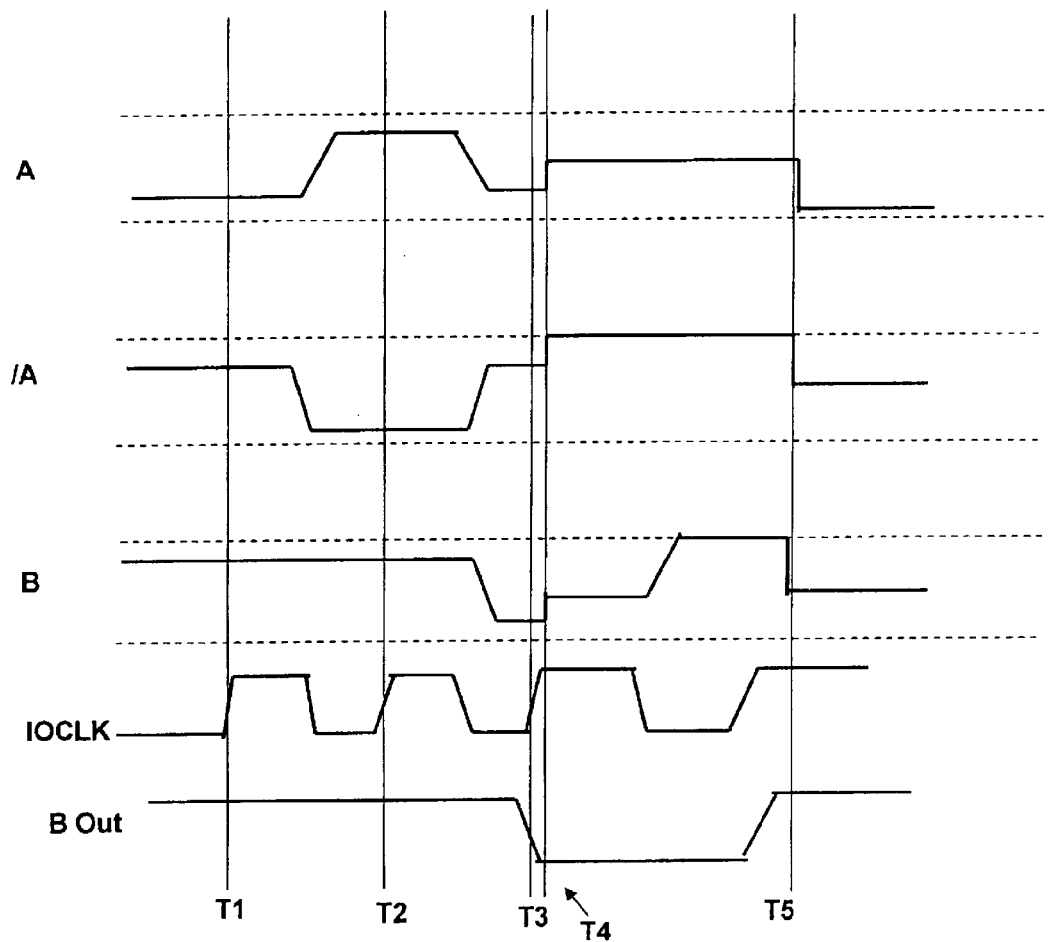
FIG. 4 is a timing diagram depicting signals within the receiver of FIG. 2.

Referring now to FIG. 4, signals within the receiver of FIG. 2 are depicted in a timing diagram, and further illustrating the operation of the singlential comparator depicted in FIG. 3B. Before time T1, data signal B and complementary data signal /A from the differential data signal pair are at a high voltage level with respect to data signal A from the differential data signal pair. Transistors N13 and N11 therefore share the current sourced into constant-current sink I11 and the voltage drop across resistor R11 will produce a logic low level at the output of singlential comparator K2. The output of singlential comparator K2 is latched and inverted, resulting in a high logic level at B Out when IOCLK transitions to a high logic state at time T1.

When the differential data signal pair transitions to the opposite logic state just prior to time T2, transistor N12 will share the current sourced into constant-current sink I11 with transistor N13, maintaining the low logic level at the drain of transistor N13 producing a logic low level at the output of singlential comparator K2, resulting in a high logic level output at B Out when IOCLK transitions again to a high logic level. When single-ended signal B transitions to a logic low level and the differential data signal pair also transistions prior to time T3, transistor N13 is turned off and the majority of the current sourced into constant-current sink I11 is sourced by transistor N11. When a common-mode voltage shift is experienced, as shown at time T4, the gate voltage of each of transistors N11, N12, and N13 is increased, but a logic low level is maintained at the output of singlential comparator K2, as transistor N11 will still conduct the majority of current sourced into constant-current source I11.

After time T4, data signal B is depicted as returning to a high logic level, which will cause transistor N13 to share current with transistor N11 producing a voltage drop across resistor R11 and producing a logic low output from singlential comparator K2. At time T5 a drop in common-mode voltage is illustrated. Transistor N13 will continue to share current equally with transistor N11 and transistor N12 will be turned more fully off due to the drop in common-mode voltage.

Common-mode rejection is provided within the singlential comparator by the action of N-channel transistors N11 and N12. Since the sum of the currents through transistors N11 and N12 represents the sum of the voltages at their inputs, it represents an average voltage, which is the common-mode voltage. As signal swing is reduced, the operation of singlential comparator K2 becomes less effective in shunting current versus sharing current, but the averaging effect can maintain detection for lowered signal swings if the gain of singlential comparator K2 is set at a high level by resistor R11 and constant-current sink I1 is operational for the low logic level input voltage. Other circuits may be implemented that derive an effective reference from a differential data signal and compare it to a single-ended data signal and thus constitute equivalent circuits for use within alternative embodiments of the present invention.

The gain of the singlential comparator is set in part by resistor R11 which has a value twice that of resistor R1 within the differential comparator of FIG. 3A. Since transistors N11 and N12 will effectively conduct twice the average current that a single transistor N1 or N2 of FIG. 3A would conduct, the doubled resistance of resistor R11 over the resistance of R1 raises the gain of the singlential comparator so that it is equal to the gain of the differential comparator of FIG. 3A. The size of transistors N1 and N2 of FIG. 3A and transistors N11, N12, and N13 should be equal, so that the gain of the differential comparator and the singlential comparator are balanced.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A comparator circuit, comprising:
   a pair of differential inputs for receiving a differential data signal pair;
   a single-ended input for receiving a single-ended data signal;
   a reference combiner, whereby a reference value for detecting said single-ended data signal is derived in conformity with analog values of both signals of said differential data signal pair; and
   a single-ended comparator for comparing an analog value of said single-ended data signal with said reference value, and having an output representative of a digital binary state of said single-ended data signal, whereby said single-ended signal is detected in conformity with a common mode value of said differential data signal pair.

2. The comparator circuit of claim 1, wherein said reference combiner comprises:
   a first controlled current source having an input coupled to a first signal of said differential data signal pair;
   a second controlled current source having an input coupled to a second signal of said differential data signal pair; and
   a current summing junction for summing an output of said first controlled current source and an output of said second controlled current source for providing said reference value.

3. The comparator circuit of claim 2, wherein said single-ended comparator comprises a third controlled current source having an input coupled to said single-ended input and an output coupled to said current summing junction for comparing said analog value of said single-ended data signal to said reference value.

4. The comparator circuit of claim 3, wherein said first controlled current source comprises a first transistor having a gate coupled to said first signal of said differential data signal pair, wherein said second controlled current source comprises a second transistor having a gate coupled to said second signal of said differential data signal pair, and wherein said third controlled current source comprises a third transistor having a gate coupled to said single-ended input.

5. The comparator circuit of claim 4, further comprising a fixed current source coupled to said current summing junction, whereby said comparator detects a difference between said analog value of said single-ended signal and an average of said analog values of said first signal and said second signal of said differential data signal pair.

6. The comparator circuit of claim 4, further comprising a first resistance coupled to a second channel connection of said third transistor, whereby a gain of said output of said single-ended comparator is determined.

7. The comparator circuit of claim 6, further comprising a differential comparator circuit for comparing said analog values of said differential data signal pair, wherein said differential comparator circuit comprises a fourth transistor having a gate coupled to said first signal of said differential data signal pair, a fifth transistor having a gate coupled to said second signal of said differential data signal pair and a first channel connection coupled to a second resistance for providing active mode operation, a second current source coupled to a channel connection of said fourth transistor and a second channel connection of said fifth transistor, whereby said differential comparator detects a difference between said first signal and said second signal of said differential data signal pair, and wherein said first resistance has a resistance value twice that of said second resistance, whereby a gain of said active mode of said differential comparator is equal to a gain of said single-ended comparator.

8. The comparator circuit of claim 2, wherein said first controlled current source comprises a first transistor having a gate coupled to said first signal of said differential data signal pair, and wherein said second controlled current source comprises a second transistor having a gate coupled to said second signal of said differential data signal pair.

9. The comparator circuit of claim 8, further comprising a fixed current source coupled to said current summing junction, whereby said reference combiner supplies a current in conformity with an average of said analog values of said differential data signal pair to said fixed current source.

10. A method for detecting a single-ended signal, said method comprising:
  receiving a single-ended data signal;
  receiving a differential data signal pair;
  combining both signals of said differential signal pair to provide a reference value;
  comparing an analog value of said single-ended signal to said reference value, whereby a binary logic state of said single-ended signal is detected in conformity with analog values of both signals of said differential signal pair.

11. The method of claim 10, wherein said combining comprises:
  controlling a first controlled current source with an analog value of a first signal of said differential data signal pair;
  controlling a second controlled current source with an analog value of a second signal of said differential data signal pair; and
  summing an output of said first controlled current source and an output of said second controlled current source to provide said reference value.

12. The method of claim 11, wherein said comparing comprises controlling a third controlled current source with said single-ended data signal, and wherein said summing further sums an output of said third controlled current source.

13. The method of claim 12, wherein said summing further sums a current supplied by a fixed current source, whereby said comparing detects a difference between said analog value of single-ended signal and an average of said analog value of said first signal and said analog value of said second signal of said differential data signal pair.

14. The method of claim 12, further comprising converting a current result of said summing to a voltage via a first resistance, whereby said comparing is performed in an active mode, producing a voltage substantially linearly proportional to a difference between said reference value and said analog value of said single-ended signal in a region where said reference value and said analog value of said single-ended signal are substantially equal.

15. The method of claim 14, further comprising second comparing said analog values of said pair of differential data signals to each other to provide a differential pair detected output, wherein said second comparing produces a second voltage via converting a difference current to said second voltage via a second resistor, and wherein said first resistor has a resistance substantially twice that of said second resistor, whereby a gain of said first comparing and a gain of said second comparing are substantially equal.

16. A comparator circuit, comprising:
  a pair of differential inputs for receiving a differential data signal pair;
  a single-ended input for receiving a single-ended data signal;
  a first transistor having a gate coupled to a first signal of said differential signal pair;
  a second transistor having a gate coupled to a second signal of said differential signal pair;
  a third transistor having a gate coupled to said single-ended input;
  a fixed current source coupled to a common connection of a first channel connection of each of said first transistor, said second transistor and said third transistor, whereby said single-ended data signal is compared to a common-mode value of said differential signal pair, and wherein an output provided from a second channel connection of said third transistor is representative of a binary state of said single-ended data signal.

17. The comparator circuit of claim 16, further comprising a first resistance coupled to said second channel connection of said third transistor, whereby a first gain of a single-ended output of said comparator is determined in an active region of operation of said comparator.

18. The comparator circuit of claim 17, further comprising:
  a fourth transistor having a gate coupled to said first signal of said differential data signal pair;
  a fifth transistor having a gate coupled to said second signal of said differential data signal pair;
  a second fixed current source coupled to a common connection of a first channel connection of each of said fourth transistor and said fifth transistor, whereby said first signal and said second signal of said differential data signal pair are compared; and
  a second resistance coupled to a second channel connection of said fifth transistor, whereby a gain of a differential output of said comparator is determined, and wherein a resistance value of said first resistance is substantially twice a resistance value of said second resistance, whereby said first gain is equal to a second gain of said differential output in an active region of operation.

* * * * *